(12) United States Patent
Chang et al.

(10) Patent No.: US 11,392,820 B2
(45) Date of Patent: Jul. 19, 2022

(54) TRANSPOSE MEMORY UNIT FOR MULTI-BIT CONVOLUTIONAL NEURAL NETWORK BASED COMPUTING-IN-MEMORY APPLICATIONS, TRANSPOSE MEMORY ARRAY STRUCTURE FOR MULTI-BIT CONVOLUTIONAL NEURAL NETWORK BASED COMPUTING-IN-MEMORY APPLICATIONS AND COMPUTING METHOD THEREOF

(71) Applicant: NATIONAL TSING HUA UNIVERSITY, Hsinchu (TW)

(72) Inventors: Meng-Fan Chang, Hsinchu (TW); Jian-Wei Su, Hsinchu (TW); Yen-Chi Chou, Hsinchu (TW); Ru-Hui Liu, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 410 days.

(21) Appl. No.: 16/742,890

(22) Filed: Jan. 14, 2020

(65) Prior Publication Data
US 2021/0216846 A1    Jul. 15, 2021

(51) Int. Cl.
*G06N 3/04* (2006.01)
*G11C 11/41* (2006.01)
(Continued)

(52) U.S. Cl.
CPC ............. *G06N 3/04* (2013.01); *G06F 7/5443* (2013.01); *G06N 3/10* (2013.01); *G11C 11/412* (2013.01); *G11C 11/418* (2013.01); *G11C 11/419* (2013.01)

(58) Field of Classification Search
CPC .......... G06N 3/04; G06N 3/10; G06N 3/0454; G06N 3/063; G06F 7/5443; G06F 7/785;
(Continued)

(56) References Cited

U.S. PATENT DOCUMENTS 10,565,492 B2 * 2/2020 Henry ................... G06N 3/0454
10,768,899 B2 * 9/2020 Koeplinger ............. G06F 7/768
2019/0279079 A1 * 9/2019 Sim ......................... G06N 20/00

OTHER PUBLICATIONS

Chang, Liang & Wang, Zhaohao & Zhang, Youguang & Zhao, Weisheng. (2019). "Multi-Port 1R1W Transpose Magnetic Random Access Memory by Hierarchical Bit-Line Switching." IEEE Access. pp. 1-1. 10.1109/ACCESS.2019.2933902. (Year: 2019).*

* cited by examiner

*Primary Examiner* — Ajay Ojha
(74) *Attorney, Agent, or Firm* — CKC & Partners Co., LLC

(57) ABSTRACT

A transpose memory unit for a plurality of multi-bit convolutional neural network based computing-in-memory applications includes a memory cell and a transpose cell. The memory cell stores a weight. The transpose cell is connected to the memory cell and receives the weight from the memory cell. The transpose cell includes an input bit line, at least one first input word line, a first output bit line, at least one second input word line and a second output bit line. One of the at least one first input word line and the at least one second input word line transmits at least one multi-bit input value, and the transpose cell is controlled by the second word line to generate a multiply-accumulate output value on one of the first output bit line and the second output bit line according to the at least one multi-bit input value multiplied by the weight.

20 Claims, 9 Drawing Sheets

(51) Int. Cl.
*G11C 11/412* (2006.01)
*G06F 7/544* (2006.01)
*G11C 11/418* (2006.01)
*G06N 3/10* (2006.01)
*G11C 11/419* (2006.01)

(58) Field of Classification Search
CPC ... G11C 11/412; G11C 11/418; G11C 11/419; G11C 7/16; G11C 7/1006; G11C 11/54
See application file for complete search history.

TRANSPOSE MEMORY UNIT FOR MULTI-BIT CONVOLUTIONAL NEURAL NETWORK BASED COMPUTING-IN-MEMORY APPLICATIONS, TRANSPOSE MEMORY ARRAY STRUCTURE FOR MULTI-BIT CONVOLUTIONAL NEURAL NETWORK BASED COMPUTING-IN-MEMORY APPLICATIONS AND COMPUTING METHOD THEREOF

BACKGROUND

Technical Field

The present disclosure relates to a memory unit, a memory array structure and a computing method thereof. More particularly, the present disclosure relates to a transpose memory unit for a plurality of multi-bit convolutional neural network (CNN) based computing-in-memory (CIM) applications, a transpose memory array structure for the multi-bit CNN based CIM applications and a computing method thereof.

Description of Related Art

In these years, due to the industrial growth of mobile device, medical electrical equipment, portable storage, etc., requirement of memory with low power, high speed and high density is increased. Computation-in-Memory (CIM) is a promising solution to improve the energy efficiency of multiplication-and-accumulation (MAC) operations for AI chips, and multiple-bit convolutional neural network (CNN) is required for high inference accuracy in many applications.

In the CNN application, a user wants to increase operation number to enhance performance. However, the user doesn't want to lose the accuracy. In general, the user will enhance input/weight bits, but this may cause degradation in operation. In addition, the value of the weight needs to be refreshed frequently in operation, thus increasing lots of latency and power consumption when reading and moving data. Accordingly, a transpose memory unit for a plurality of multi-bit CNN based CIM applications, a transpose memory array structure for the multi-bit CNN based CIM applications and a computing method thereof having the features of reducing the latency and power consumption without causing the write disturb issue are commercially desirable.

SUMMARY

According to one aspect of the present disclosure, a transpose memory unit for a plurality of multi-bit convolutional neural network (CNN) based computing-in-memory (CIM) applications is controlled by a first word line and a second word line. The transpose memory unit for the multi-bit CNN based CIM applications includes a memory cell and a transpose cell. The memory cell stores a weight. The memory cell is controlled by the first word line and includes a local bit line transmitting the weight. The transpose cell is connected to the memory cell and receives the weight via the local bit line. The transpose cell includes an input bit line, at least one first input word line, a first output bit line, at least one second input word line and a second output bit line. One of the at least one first input word line and the at least one second input word line transmits at least one multi-bit input value, and the transpose cell is controlled by the second word line to generate a multiply-accumulate output value on one of the first output bit line and the second output bit line according to the at least one multi-bit input value multiplied by the weight.

According to another aspect of the present disclosure, a transpose memory array structure for a plurality of multi-bit CNN based CIM applications is controlled by a first word line and a second word line. The transpose memory array structure for the multi-bit CNN based CIM applications includes a plurality of transpose memory units connected to each other via the first word line and the second word line. Each of the transpose memory units includes a memory cell and a transpose cell. The memory cell stores a weight. The memory cell is controlled by the first word line and includes a local bit line transmitting the weight. The transpose cell is connected to the memory cell and receives the weight via the local bit line. The transpose cell includes an input bit line, at least one first input word line, a first output bit line, at least one second input word line and a second output bit line. One of the at least one first input word line and the at least one second input word line transmits at least one multi-bit input value, and the transpose cell is controlled by the second word line to generate a multiply-accumulate output value on one of the first output bit line and the second output bit line according to the at least one multi-bit input value multiplied by the weight.

According to further another aspect of the present disclosure, a computing method of the transpose memory array structure for the multi-bit CNN based CIM applications is controlled by the first word line and the second word line. The computing method includes a voltage level applying step and a computing step. The voltage level applying step includes applying a plurality of voltage levels to the first word line, the second word line, the weight, the at least one first input word line and the at least one second input word line of each of the transpose memory units, respectively. The computing step includes driving the transpose cell of each of the transpose memory units to compute the voltage levels of the weight, the at least one first input word line and the at least one second input word line so as to generate the multiply-accumulate output value on the one of the first output bit line and the second output bit line according to the at least one multi-bit input value multiplied by the weight.

BRIEF DESCRIPTION OF THE DRAWINGS

The present disclosure can be more fully understood by reading the following detailed description of the embodiment, with reference made to the accompanying drawings as follows.

DETAILED DESCRIPTION

The embodiment will be described with the drawings. For clarity, some practical details will be described below. However, it should be noted that the present disclosure should not be limited by the practical details, that is, in some embodiment, the practical details is unnecessary. In addition, for simplifying the drawings, some conventional structures and elements will be simply illustrated, and repeated elements may be represented by the same labels.

It will be understood that when an element (or device) is referred to as be "connected to" another element, it can be directly connected to the other element, or it can be indirectly connected to the other element, that is, intervening elements may be present. In contrast, when an element is referred to as be "directly connected to" another element, there are no intervening elements present. In addition, the terms first, second, third, etc. are used herein to describe various elements or components, these elements or components should not be limited by these terms. Consequently, a first element or component discussed below could be termed a second element or component.

Before describing any embodiments in detail, some terms used in the following are described. A voltage level of "1" represents that the voltage is equal to a power supply voltage VDD. The voltage level of "0" represents that the voltage is equal to a ground voltage VSS. A PMOS transistor and an NMOS transistor represent a P-type MOS transistor and an N-type MOS transistor, respectively. Each transistor has a source, a drain and a gate.

Figure 1:
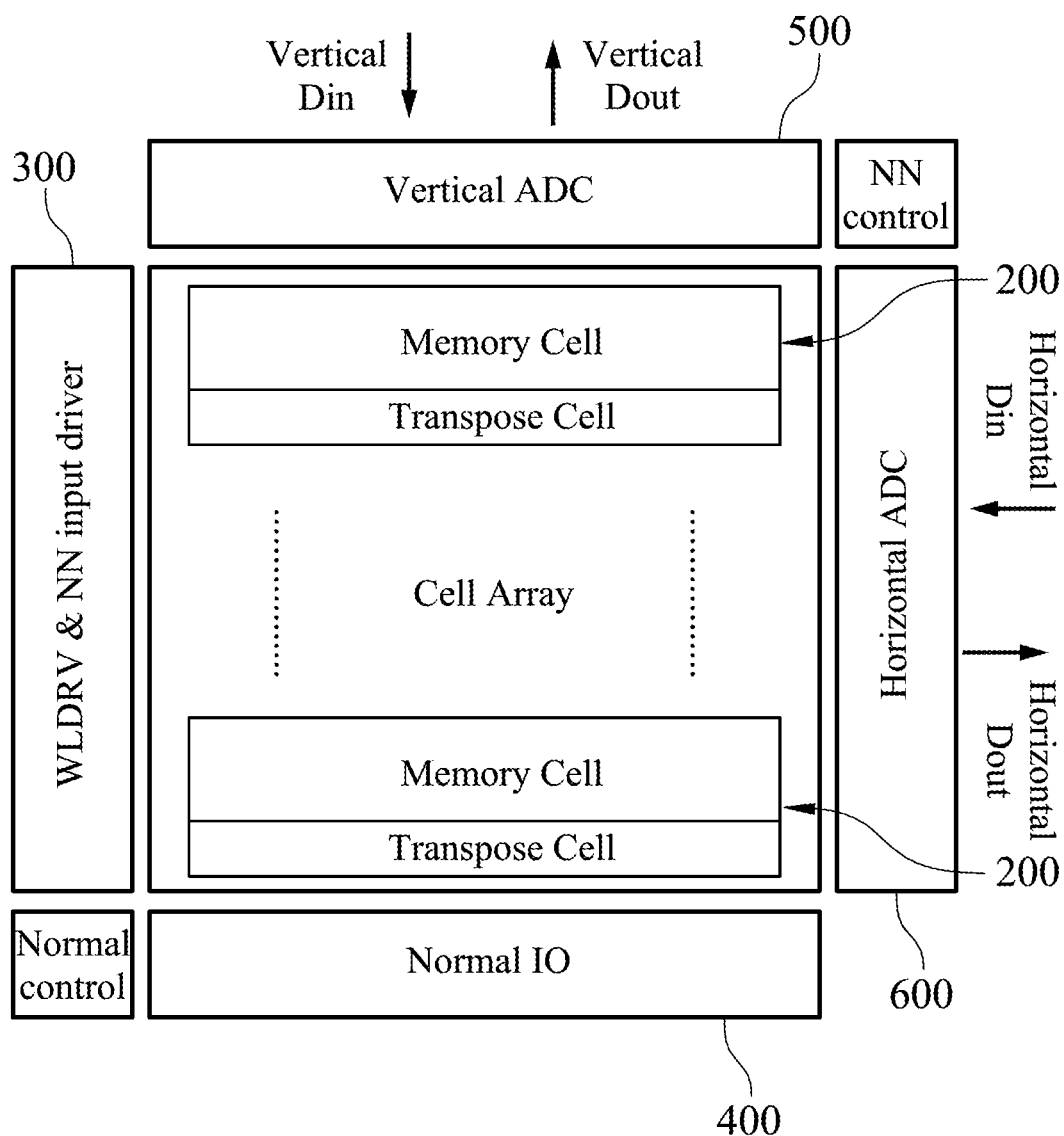
FIG. 1 shows a block diagram of a transpose memory array structure for a plurality of multi-bit convolutional neural network based computing-in-memory applications according to a first embodiment of the present disclosure.
Figure 2:
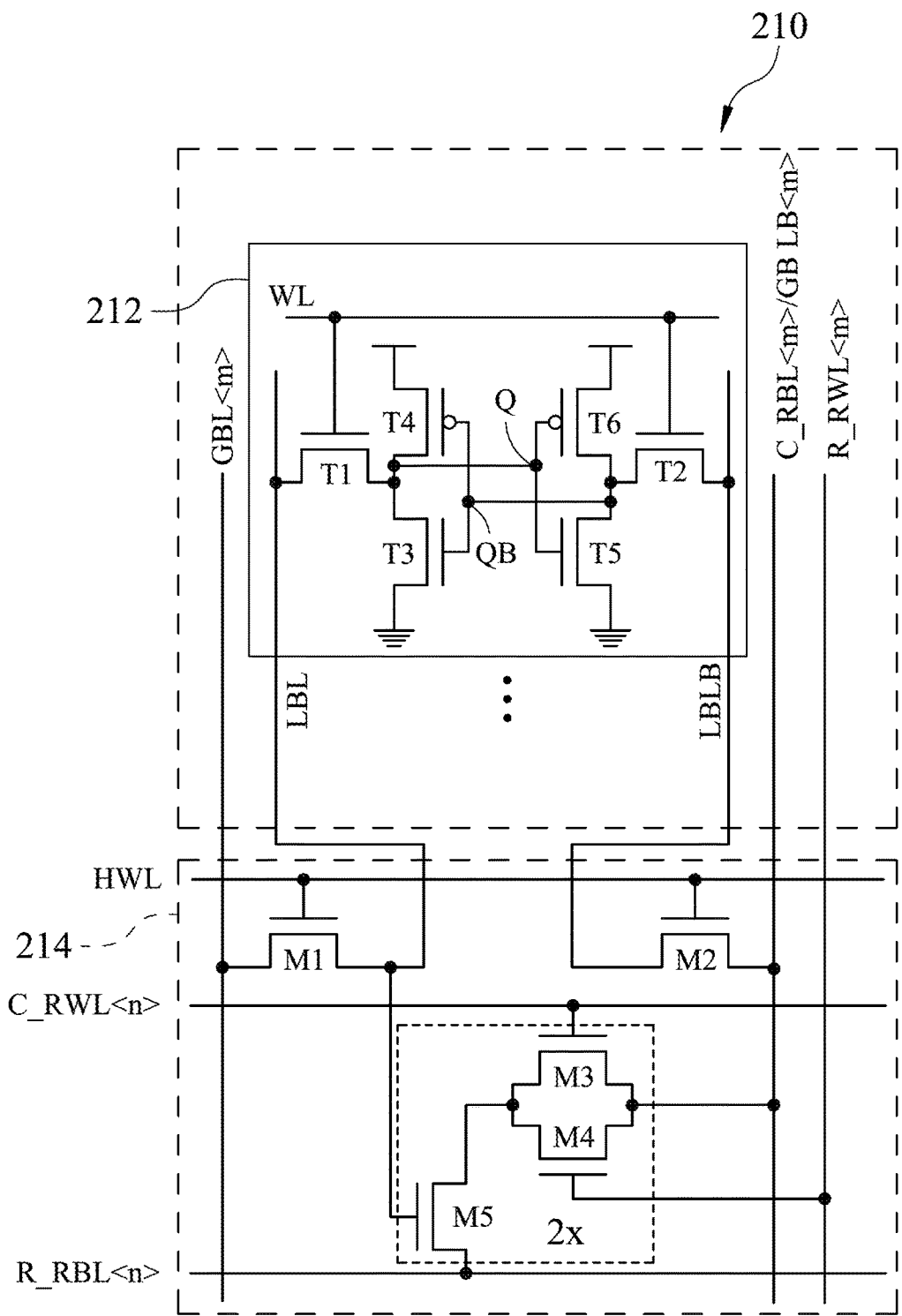
FIG. 2 shows a circuit diagram of a first type of one of a plurality of transpose memory units of the transpose memory array structure of FIG. 1.

FIG. 1 shows a block diagram of a transpose memory array structure 100 for a plurality of multi-bit convolutional neural network (CNN) based computing-in-memory (CIM) applications according to a first embodiment of the present disclosure. FIG. 2 shows a circuit diagram of a first type of one of a plurality of transpose memory units 210 of the transpose memory array structure 100 of FIG. 1. In FIGS. 1 and 2, the transpose memory array structure 100 for the multi-bit CNN based CIM applications is controlled by a first word line WL and a second word line HWL. The transpose memory array structure 100 for the multi-bit CNN based CIM applications includes a plurality of local memory array units 200, a word line driver 300, a normal input-output (IO) circuit 400, a vertical analog-to-digital converter 500 and a horizontal analog-to-digital converter 600.

The local memory array units 200 are connected to each other. Each of the local memory array units 200 includes the transpose memory units 210. The transpose memory units 210 are connected to each other via the first word line WL and the second word line HWL. Each of the transpose memory units 210 includes at least one memory cell 212 and the transpose cell 214. In one embodiment, the number of the at least one memory cell 212 may be 16× (e.g., 16, 32, and so on).

The memory cell 212 stores a weight (1-bit weight). The memory cell 212 is controlled by the first word line WL. In detail, the memory cell 212 includes a first node Q, a second node QB, a local bit line BLB, a local bit line bar LBLB, a first memory cell transistor T1, a second memory cell transistor T2, a first inverter INV1 and a second inverter INV2. The first node Q stores the weight. The second node QB stores an inverted weight opposite to the weight of the first node Q. The local bit line BLB is connected to the transpose cell 214 and transmits the weight from the memory cell 212 to the transpose cell 214. The local bit line bar LBLB is connected to the transpose cell 214 and transmits the inverted weight from the memory cell 212 to the transpose cell 214. The first memory cell transistor T1 is connected to the first node Q, the local bit line LBL and the first word line WL. The second memory cell transistor T2 is connected to the second node QB, the local bit line bar LBLB and the first word line WL. The first inverter INV1 is located between the first node Q and the second node QB. The first inverter INV1 includes a third memory cell transistor T3 and a fourth memory cell transistor T4 connected to the third memory cell transistor T3. The second inverter INV2 is connected to the first inverter INV1. The second inverter INV2 includes a fifth memory cell transistor T5 and a sixth memory cell transistor T6 connected to the fifth memory cell transistor T5. In other words, the memory cell 212 is a 6T static random access memory (SRAM) cell. Each of the first memory cell transistor T1, the second memory cell transistor T2, the third memory cell transistor T3 and the fifth memory cell transistor T5 is the NMOS transistor. Each of the fourth memory cell transistor T4 and the sixth memory cell transistor T6 is the PMOS transistor.

The transpose cell 214 is connected to the memory cell 212 and receives the weight via the local bit line LBL. The transpose cell 214 includes an input bit line GBL<m>, a first input word line C_RWL<n>, a first output bit line C_RBL<m>, a second input word line R_RWL<m> and a second output bit line R_RBL<n>. "m" and "n" represent an mth column and an nth row, respectively. Each of "m" and "n" is an integer which is greater than or equal to 0. One of the first input word line C_RWL<n> and the second input word line R_RWL<m> transmits a multi-bit input value, and the transpose cell 214 is controlled by the second word line HWL to generate a multiply-accumulate output value on one of the first output bit line C_RBL<m> and the second output bit line R_RBL<n> according to the multi-bit input value multiplied by the weight. In detail, the first output bit line C_RBL<m> can also be represented by an input bit line bar GBLB<m>, i.e., the first output bit line C_RBL<m> and the input bit line bar GBLB<m> share the same line and are represented as "C_RBL<m>/GBLB<m>" in FIG. 2. The multi-bit input value is a digital signal. The first input word line C_RWL<n> and the second output bit line R_RBL<n> are extended in a horizontal direction, and the first output bit line C_RBL<m> and the second input word line R_RWL<m> are extended in a vertical direction. Moreover, the transpose cell 214 includes a first transpose cell transistor M1, a second transpose cell transistor M2, a third transpose cell transistor M3, a fourth transpose cell transistor M4 and a fifth transpose cell transistor M5. The first transpose cell transistor M1 is connected to the second word line HWL, the input bit line GBL<m> and the local bit line LBL. The second transpose cell transistor M2 is connected to the second word line HWL, the first output bit line C_RBL<m> and the local bit line bar LBLB. The third transpose cell transistor M3 is connected to the first input word line C_RWL<n>, the first output bit line C_RBL<m> and a third node. The fourth transpose cell transistor M4 is connected to the second input word line R_RWL<m>, the first output bit line C_RBL<m> and the third node. The fifth transpose cell transistor M5 is connected to the local bit line LBL, the second output bit line R_RBL<n> and the third node. Each of the first transpose cell transistor M1, the second transpose cell transistor M2, the third transpose cell transistor M3, the fourth transpose cell transistor M4 and the fifth transpose cell transistor M5 is the NMOS transistor. Each of the third transpose cell transistor M3, the fourth transpose cell transistor M4 and the fifth transpose cell transistor M5 has a first transistor width. Each of the first transpose cell transistor M1, the second transpose cell transistor M2 has a second transistor width. The first transistor width is equal to twice the second transistor width.

Table 1 lists the multi-bit input values (Input), the weights (Weight) and the multiply-accumulate output values (MAC) of the first type of the transpose memory unit 210 of FIG. 2, in a column multiply-accumulate operation. The multiply-accumulate output values can be computed by the multi-bit input values and the weights in the vertical direction. The voltage levels of the second input word line R_RWL<m> and the second output bit line R_RBL<n> are all equal to VSS (0 V). The multi-bit input value is corresponding to the voltage level of the first input word line C_RWL<n> and is equal to 1 (i.e., VDD) or 0 (i.e., VSS). The weight is corresponding to the voltage level on the local bit line LBL. The multiply-accumulate output value is corresponding to a current on the first output bit line C_RBL<m> (Input× Weight). In one embodiment, the multi-bit input value may be regarded as "Horizontal Din", and the multiply-accumulate output value may be regarded as "Vertical Dout", as shown in FIG. 1.

TABLE 1

| Input (C_RWL<n>) | Weight (LBL(Q)) | Input × Weight (C_RBL<m>) | MAC |
|---|---|---|---|
| 1 | 1 | 1 × Idis | 1 |
| 0 |   | 0 × Idis | 0 |
| 1 | 0 | 0 × Idis | 0 |
| 0 |   | 0 × Idis | 0 |

Table 2 lists the multi-bit input values (Input), the weights (Weight) and the multiply-accumulate output values (MAC) of the first type of the transpose memory unit 210 of FIG. 2, in a row multiply-accumulate operation. The multiply-accumulate output values can be computed by the multi-bit input values and the weights in the horizontal direction. The voltage levels of the first input word line C_RWL<n> and the first output bit line C_RBL<m> are all equal to VSS (0 V). The multi-bit input value is corresponding to the voltage level of the second input word line R_RWL<m> and is equal to 1 (i.e., VDD) or 0 (i.e., VSS). The weight is corresponding to the voltage level on the local bit line LBL. The multiply-accumulate output value is corresponding to a current on the second output bit line R_RBL<n> (Input×Weight). In one embodiment, the multi-bit input value may be regarded as "Vertical Din", and the multiply-accumulate output value may be regarded as "Horizontal Dout", as shown in FIG. 1.

TABLE 2

| Input (R_RWL<m>) | Weight (LBL(Q)) | Input × Weight (R_RBL<n>) | MAC |
|---|---|---|---|
| 1 | 1 | 1 × Idis | 1 |
| 0 |   | 0 × Idis | 0 |
| 1 | 0 | 0 × Idis | 0 |
| 0 |   | 0 × Idis | 0 |

The word line driver 300 is connected to each of the local memory array units 200 via the first word line WL and the second word line HWL. The word line driver 300 is represented as "WLDRV & NN input driver" and is located on a left side of the local memory array units 200. The word line driver 300 generates the voltage level of the first word line WL and the voltage level of the second word line HWL to control each of the local memory array units 200.

The normal IO circuit 400 is connected to each of the local memory array units 200 via the input bit line GBL<m> and the input bit line bar GBLB<m> (i.e., the first output bit line C_RBL<m>). The normal IO circuit 400 is represented as "Normal IO" and is located on a bottom side of the local memory array units 200. The normal IO circuit 400 receives the weights from the local memory array units 200.

The vertical analog-to-digital converter 500 is connected to each of the local memory array units 200 via the first output bit line C_RBL<m> and the second input word line R_RWL<m>. The vertical analog-to-digital converter 500 is represented as "Vertical ADC" and is located on a top side of the local memory array units 200. The vertical analog-to-digital converter 500 receives the multiply-accumulate output values (MAC) from the local memory array units 200 in the vertical direction.

The horizontal analog-to-digital converter 600 is connected to each of the local memory array units 200 via the first input word line C_RWL<n> and the second output bit line R_RBL<n>. The horizontal analog-to-digital converter 600 is represented as "Horizontal ADC" and is located on a right side of the local memory array units 200. The horizontal analog-to-digital converter 600 receives the multiply-accumulate output values (MAC) from the local memory array units 200 in the horizontal direction.

When the first transpose cell transistor M1 and the second transpose cell transistor M2 are turned on by the second word line HWL, the transpose memory unit 210 is operated in a normal mode. The voltage level of the first word line WL and the voltage level of the second word line HWL are both equal to 1. In the normal mode, the memory cell 212 is processed in one of a normal read operation and a normal write operation. The normal read operation represents that the weight in the memory cell 212 may be transmitted to the input bit line GBL<m> via the local bit line LBL and the first transpose cell transistor M1. The inverted weight may be transmitted to the input bit line bar GBLB<m> via the local bit line bar LBLB and the second transpose cell transistor M2. Then, the weight and the inverted weight may be transmitted from the local memory array unit 200 to the normal IO circuit 400 via the input bit line GBL<m> and the input bit line bar GBLB<m>, respectively. The normal write operation represents that the weight is transmitted from the input bit line GBL<m> to the memory cell 212 via the first transpose cell transistor M1 and the local bit line LBL.

When the first transpose cell transistor M1 and the second transpose cell transistor M2 are turned off by the second word line HWL, the transpose memory unit 210 is operated in a CIM mode. The voltage level of the first word line WL and the voltage level of the second word line HWL are equal to 1 and 0, respectively, so that the weight in the memory cell 212 is configured to control the fifth transpose cell transistor M5 to establish a current path via the fifth transpose cell transistor M5 and one of the third transpose cell transistor M3 and the fourth transpose cell transistor M4.

Accordingly, the transpose memory unit 210 for the multi-bit CNN based CIM applications and the transpose memory array structure 100 for the multi-bit CNN based CIM applications of the present disclosure can operate the multi-bit input values and the weights at the same time without causing the write disturb issue, and utilize a two way transpose array to do training and inference in the horizontal and vertical directions respectively, thereby substantially reducing the latency and power consumption.

Figure 3:
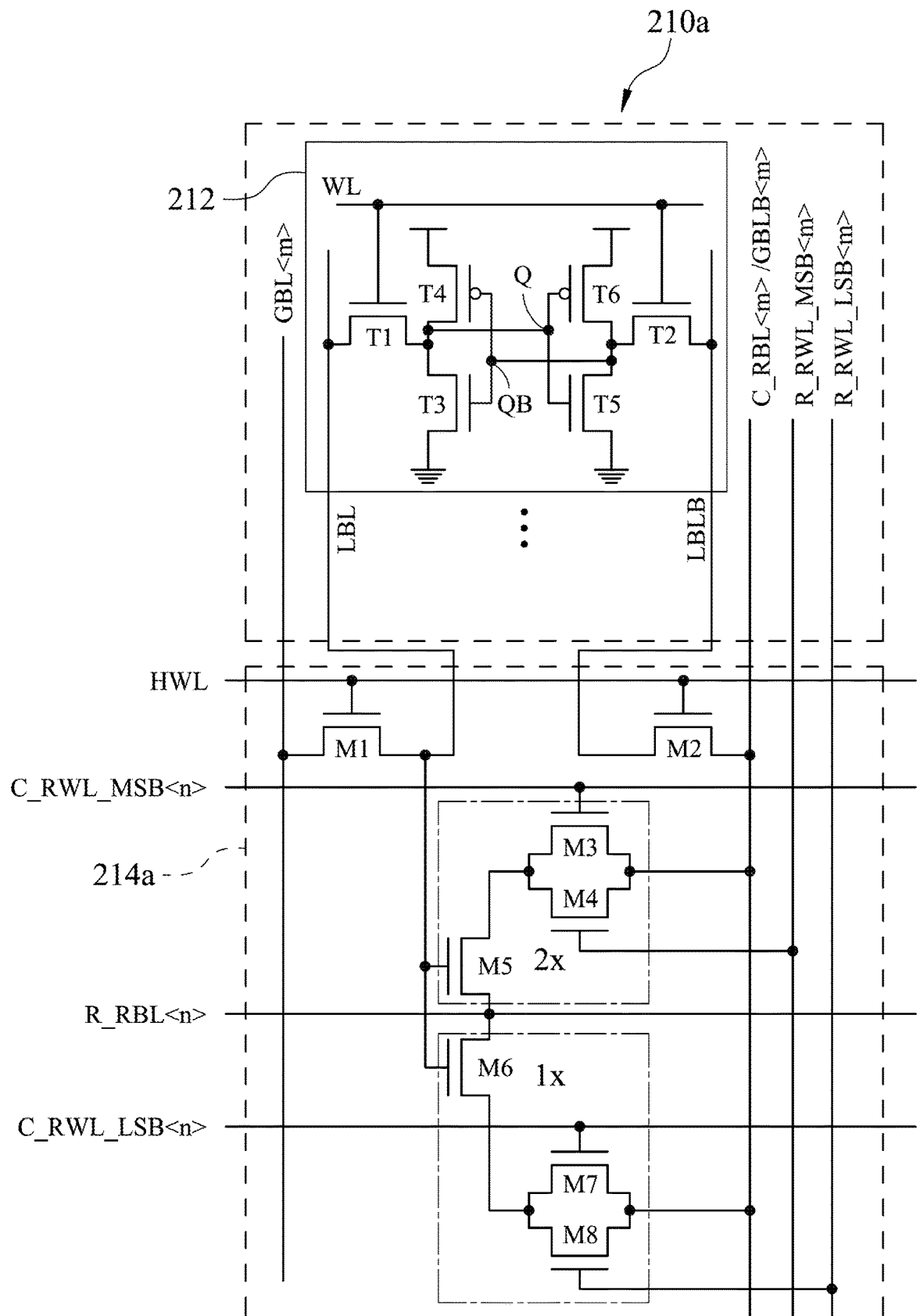
FIG. 3 shows a circuit diagram of a second type of one of a plurality of transpose memory units according to a second embodiment of the present disclosure.
Figure 4:
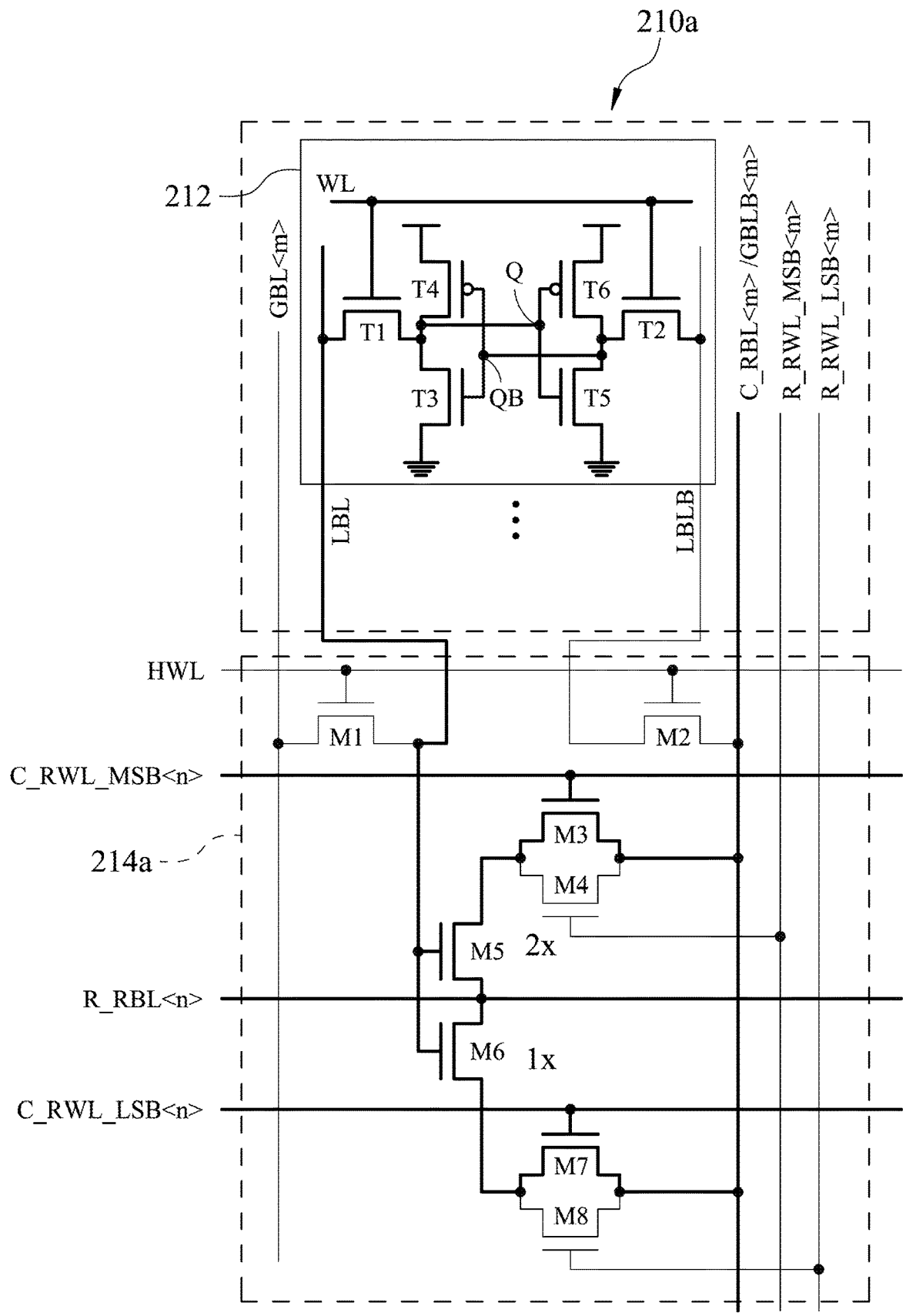
FIG. 4 shows a circuit diagram of a column multiply-accumulate operation of the second type of the one of the transpose memory units of FIG. 3, with a 2-bit input and a 1-bit weight.
Figure 5:
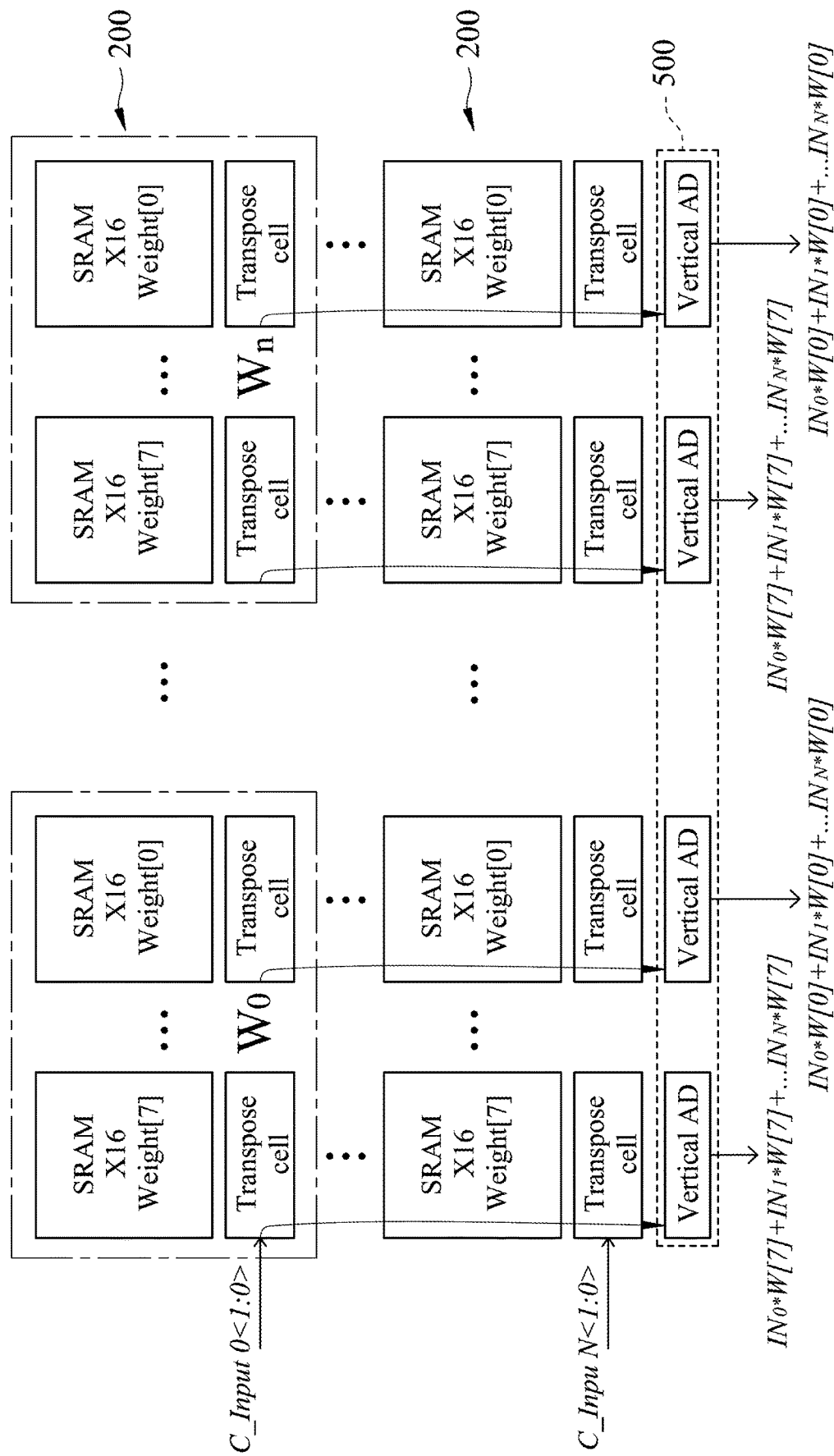
FIG. 5 shows a circuit diagram of a column multiply-accumulate operation of a transpose memory array structure according to a third embodiment of the present disclosure, which the transpose memory array structure includes the plurality of the transpose memory units of FIG. 3, with 2-bit inputs and 8-bit weights.
Figure 6:
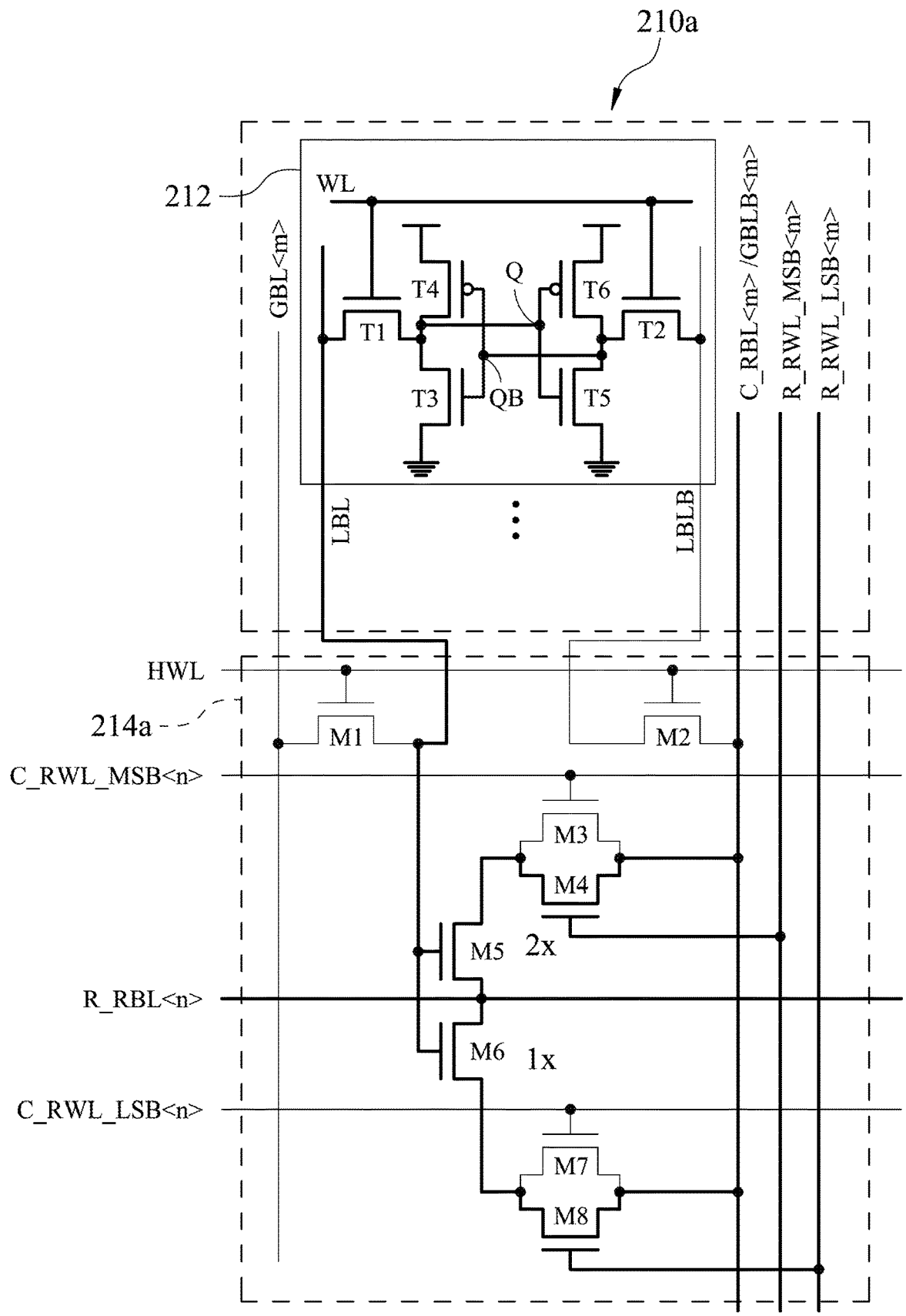
FIG. 6 shows a circuit diagram of a row multiply-accumulate operation of the second type of the one of the transpose memory units of FIG. 3, with a 2-bit input and a 1-bit weight.
Figure 7:
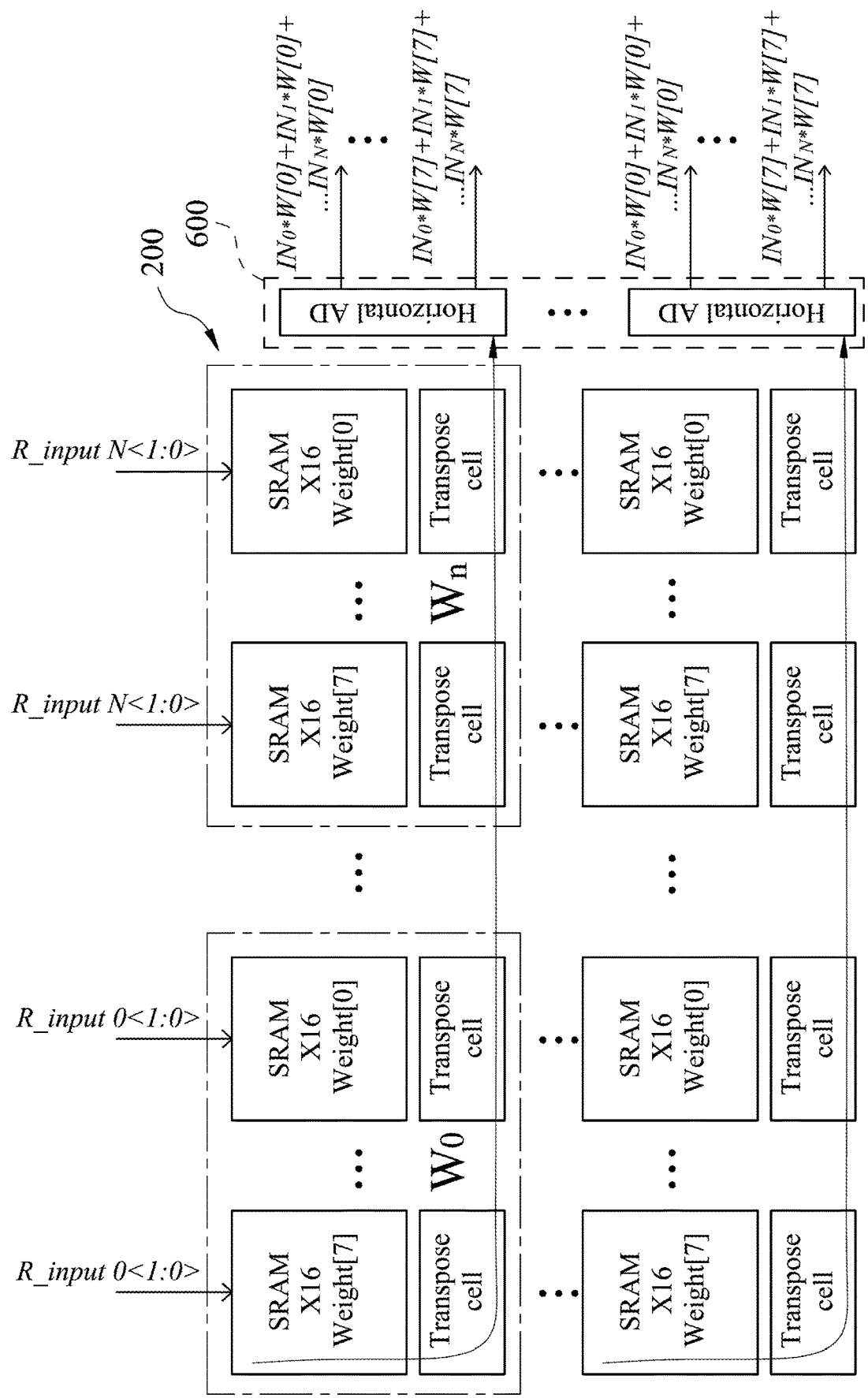
FIG. 7 shows a circuit diagram of a row multiply-accumulate operation of the transpose memory array structure of FIG. 5, with 2-bit inputs and 8-bit weights.

FIG. 3 shows a circuit diagram of a second type of one of a plurality of transpose memory units 210a according to a second embodiment of the present disclosure. FIG. 4 shows a circuit diagram of a column multiply-accumulate operation of the second type of the one of the transpose memory units 210a of FIG. 3, with a 2-bit input and a 1-bit weight. FIG. 5 shows a circuit diagram of a column multiply-accumulate operation of a transpose memory array structure 100 according to a third embodiment of the present disclosure, which the transpose memory array structure 100 includes the plurality of transpose memory units 210a of FIG. 3, with 2-bit inputs and 8-bit weights. FIG. 6 shows a circuit diagram of a row multiply-accumulate operation of the second type of the one of the transpose memory units 210a of FIG. 3, with a 2-bit input and a 1-bit weight. FIG. 7 shows a circuit diagram of a row multiply-accumulate operation of the transpose memory array structure 100 of FIG. 5, with 2-bit inputs and 8-bit weights. In FIGS. 1 and 3-7, the transpose memory array structure 100 for the multi-bit CNN based CIM applications is controlled by a first word line WL and a second word line HWL. The transpose memory array structure 100 for the multi-bit CNN based CIM applications includes a plurality of local memory array units 200, a word line driver 300, a normal IO circuit 400, a vertical analog-to-digital converter 500 and a horizontal analog-to-digital converter 600.

The local memory array units 200 are connected to each other. Each of the local memory array units 200 includes the transpose memory units 210a. The transpose memory units 210a are connected to each other via the first word line WL and the second word line HWL. Each of the transpose memory units 210a includes at least one memory cell 212 and the transpose cell 214a. In one embodiment, the number of the at least one memory cell 212 may be 16× (e.g., 16, 32, and so on). In FIGS. 3, 4 and 6, the detail of the memory cell 212 is the same as the memory cell 212 of FIG. 2, and will not be described again herein.

The transpose cell 214a is connected to the memory cell 212 and receives the weight via the local bit line LBL. The transpose cell 214a includes an input bit line GBL<m>, two first input word lines C_RWL_MSB<n>, C_RWL_LSB<n>, a first output bit line C_RBL<m>, two second input word lines R_RWL_MSB<m>, R_RWL_LSB<m> and a second output bit line R_RBL<n>. "m" and "n" represent an mth column and an nth row, respectively. Each of "m" and "n" is an integer which is greater than or equal to 0. In one embodiment, "m" and "n" are equal to 128 and 512, respectively. The two first input word lines C_RWL_MSB<n>, C_RWL_LSB<n> or the two second input word lines R_RWL_MSB<m>, R_RWL_LSB<m> transmit two multi-bit input values, respectively. The transpose cell 214a is controlled by the second word line HWL to generate a multiply-accumulate output value on one of the first output bit line C_RBL<m> and the second output bit line R_RBL<n> according to the two multi-bit input values multiplied by the weight. In detail, the first output bit line C_RBL<m> can also be represented by an input bit line bar GBLB<m>, i.e., the first output bit line C_RBL<m> and the input bit line bar GBLB<m> share the same line and are represented as "C_RBL<m>/GBLB<m>" in FIG. 3. Each of the two multi-bit input values is a digital signal. The two first input word lines C_RWL_MSB<n>, C_RWL_LSB<n> and the second output bit line R_RBL<n> are extended in a horizontal direction, and the first output bit line C_RBL<m> and the two second input word lines R_RWL_MSB<m>, R_RWL_LSB<m> are extended in a vertical direction.

Moreover, the transpose cell 214a includes a first transpose cell transistor M1, a second transpose cell transistor M2, a third transpose cell transistor M3, a fourth transpose cell transistor M4, a fifth transpose cell transistor M5, a sixth transpose cell transistor M6, a seventh transpose cell transistor M7 and an eighth transpose cell transistor M8. The first transpose cell transistor M1 is connected to the second word line HWL, the input bit line GBL<m> and the local bit line LBL. The second transpose cell transistor M2 is connected to the second word line HWL, the first output bit line C_RBL<m> and the local bit line bar LBLB. The third transpose cell transistor M3 is connected to one of the two first input word lines C_RWL_MSB<n>, the first output bit line C_RBL<m> and a third node. The fourth transpose cell transistor M4 is connected to one of the two second input word lines R_RWL_MSB<m>, the first output bit line C_RBL<m> and the third node. The fifth transpose cell transistor M5 is connected to the local bit line LBL, the second output bit line R_RBL<n> and the third node. The sixth transpose cell transistor M6 is connected to the local bit line LBL, the second output bit line R_RBL<n> and a fourth node. The seventh transpose cell transistor M7 is connected to another of the two first input word lines C_RWL_LSB<n>, the first output bit line C_RBL<m> and the fourth node. The eighth transpose cell transistor M8 is connected to another of the two second input word lines R_RWL_LSB<m>, the first output bit line C_RBL<m> and the fourth node. Each of the third transpose cell transistor M3, the fourth transpose cell transistor M4 and the fifth transpose cell transistor M5 has a first transistor width. Each of the sixth transpose cell transistor M6, the seventh transpose cell transistor M7, the eighth transpose cell transistor M8 has a second transistor width, and the first transistor width is equal to twice the second transistor width.

Table 3 lists the multi-bit input values (Input), the weights (Weight) and the multiply-accumulate output values (MAC) of the second type of the transpose memory unit 210a of FIG. 3, in a column multiply-accumulate operation. In FIGS. 4, 5 and Table 3, the multiply-accumulate output values can be computed by the multi-bit input values and the weights in the vertical direction. The voltage levels of the two second input word lines R_RWL_MSB<m>, R_RWL_LSB<m> and the second output bit line R_RBL<n> are all equal to VSS (0 V). The two multi-bit input values are corresponding to the voltage levels of the two first input word lines C_RWL_MSB<n>, C_RWL_LSB<n>, respectively. The two multi-bit input values may be "11", "10", "01" or "00". The weight is corresponding to the voltage level on the local bit line LBL. The multiply-accumulate output value is corresponding to a current on the first output bit line C_RBL<m> (Input×Weight).

TABLE 3

| Input | | Weight | Input × Weight | |
|---|---|---|---|---|
| C_RWL_MSB<n> | C_RWL_LSB<n> | (LBL(Q)) | (C_RBL<m>) | MAC |
| 1 | 1 | 1 | 3 × Idis | 3 |
| 1 | 0 | | 2 × Idis | 2 |
| 0 | 1 | | 1 × Idis | 1 |
| 0 | 0 | | 0 × Idis | 0 |
| 1 | 1 | 0 | 0 × Idis | 0 |
| 1 | 0 | | 0 × Idis | 0 |
| 0 | 1 | | 0 × Idis | 0 |
| 0 | 0 | | 0 × Idis | 0 |

Table 4 lists the multi-bit input values (Input), the weights (Weight) and the multiply-accumulate output values (MAC) of the second type of the transpose memory unit 210a of FIG. 3, in a row multiply-accumulate operation. In FIGS. 6, 7 and Table 4, the multiply-accumulate output values can be computed by the multi-bit input values and the weights in the horizontal direction. The voltage levels of the two first input word lines C_RWL_MSB<n>, C_RWL_LSB<n> and the first output bit line C_RBL<m> are all equal to VSS (0 V). The two multi-bit input values are corresponding to the voltage levels of the two second input word lines R_RWL_MSB<m>, R_RWL_LSB<m>, respectively. The two multi-bit input values may be "11", "10", "01" or "00". The weight is corresponding to the voltage level on the local bit line LBL. The multiply-accumulate output value is corresponding to a current on the second output bit line R_RBL<n> (Input×Weight).

TABLE 4

| Input | | Weight | Input × Weight | |
|---|---|---|---|---|
| R_RWL_MSB<m> | R_RWL_LSB<m> | (LBL(Q)) | (R_RBL<n>) | MAC |
| 1 | 1 | 1 | 3 × Idis | 3 |
| 1 | 0 | | 2 × Idis | 2 |
| 0 | 1 | | 1 × Idis | 1 |
| 0 | 0 | | 0 × Idis | 0 |
| 1 | 1 | 0 | 0 × Idis | 0 |
| 1 | 0 | | 0 × Idis | 0 |
| 0 | 1 | | 0 × Idis | 0 |
| 0 | 0 | | 0 × Idis | 0 |

When the first transpose cell transistor M1 and the second transpose cell transistor M2 are turned on by the second word line HWL, the transpose memory unit 210a is operated in a normal mode. In the normal mode, the memory cell 212 is processed in one of a normal read operation and a normal write operation. The normal read operation represents that the weight in the memory cell 212 is transmitted to the input bit line GBL<m> via the local bit line LBL and the first transpose cell transistor M1. The normal write operation represents that the weight is transmitted from the input bit line GBL<m> to the memory cell 212 via the first transpose cell transistor M1 and the local bit line LBL. On the contrary, when the first transpose cell transistor M1 and the second transpose cell transistor M2 are turned off by the second word line HWL, the transpose memory unit 210a is operated in a CIM mode. The weight in the memory cell 212 is configured to control the fifth transpose cell transistor M5 and the sixth transpose cell transistor M6 to establish two current paths via the fifth transpose cell transistor M5, the sixth transpose cell transistor M6, one of the third transpose cell transistor M3 and the fourth transpose cell transistor M4 and one of the seventh transpose cell transistor M7 and the eighth transpose cell transistor M8. In FIG. 5, the local memory array units 200 of the transpose memory array structure 100 are operated to generate the multiply-accumulate output values ($IN_0*W[0]+IN_1*W[0]+ \ldots IN_N*W[0]$, $IN_0*W[7]+IN_1*W[7]+ \ldots IN_N*W[7]$) with 2-bit inputs (R_input 0<1:0>, R_input N<1:0>) and 8-bit weights (Weight[0]-Weight[7]) in the vertical direction. In FIG. 7, the local memory array units 200 of the transpose memory array structure 100 are operated to generate the multiply-accumulate output values ($IN_0*W[0]+IN_1*W[0]+ \ldots IN_N*W[0]$, $IN_0*W[7]+IN_1*W[7]+ \ldots IN_N*W[7]$) with 2-bit inputs (R_input 0<1:0>, R_input N<1:0>) and 8-bit weights (Weight[0]-Weight[7]) in the horizontal direction. Therefore, the transpose memory unit 210a for the multi-bit CNN based CIM applications and the transpose memory array structure 100 for the multi-bit CNN based CIM applications of the present disclosure can operate the multi-bit input values and the weights at the same time without causing the write disturb issue, and utilize a two way transpose array to do training and inference in the horizontal and vertical directions respectively, thereby substantially reducing the latency and power consumption.

Figure 8:
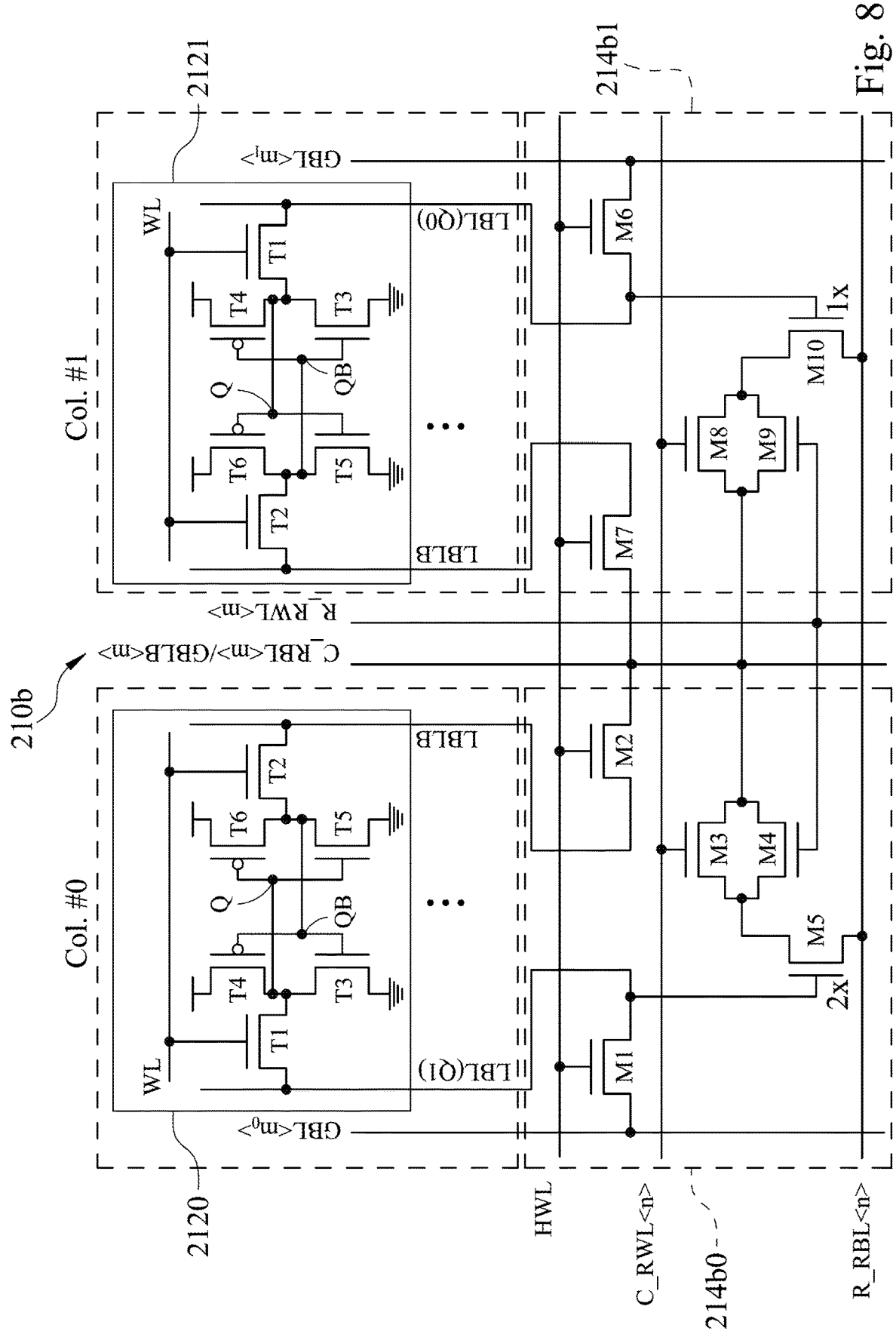
FIG. 8 shows a circuit diagram of a third type of one of a plurality of transpose memory units according to a fourth embodiment of the present disclosure.

FIG. 8 shows a circuit diagram of a third type of one of a plurality of transpose memory units 210b according to a fourth embodiment of the present disclosure. Each of the transpose memory units 210b includes two memory cells 2120, 2121 and two transpose cells 214b0, 214b1. The detail of each of the two memory cells 2120, 2121 is the same as the memory cell 212 of FIG. 2. The detail of the transpose cell 214b0 is the same as the transpose cell 214 of FIG. 2, and will not be described again herein.

The two memory cells 2120, 2121 store two weights, respectively. The two memory cells 2120, 2121 are controlled by the first word line WL. The transpose cell 214b1 is connected to the memory cell 2121, a first input word line C_RWL<n>, a first output bit line C_RBL<m>, a second input word line R_RWL<m> and a second output bit line R_RBL<n>. The transpose cell 214b1 receives the weight from the memory cell 2121. The two transpose cells 214b0, 214b1 are controlled by the second word line HWL to generate a multiply-accumulate output value (MAC) on one of the first output bit line C_RBL<m> and the second output bit line R_RBL<n> according to a multi-bit input value multiplied by two multi-bit weights, and the two multi-bit weights are formed by the weight of the memory cell 2120 and the weight of the memory cell 2121. In addition, the transpose cell 214b1 includes a sixth transpose cell transistor M6, a seventh transpose cell transistor M7, an eighth transpose cell transistor M8, a ninth transpose cell transistor M9 and a tenth transpose cell transistor M10. The sixth transpose cell transistor M6, the seventh transpose cell transistor M7, the eighth transpose cell transistor M8, the ninth transpose cell transistor M9 and the tenth transpose cell transistor M10 are corresponding to the first transpose cell transistor M1, the second transpose cell transistor M2, the third transpose cell transistor M3, the fourth transpose cell transistor M4 and the fifth transpose cell transistor M5. Each of the third transpose cell transistor M3, the fourth transpose cell transistor M4 and the fifth transpose cell transistor M5 has a first transistor width. Each of the eighth transpose cell transistor M8, the ninth transpose cell transistor M9 and the tenth transpose cell transistor M10 has a second transistor width, and the first transistor width is equal to twice the second transistor width.

Table 5 lists the multi-bit input values (Input), the multi-bit weights (Weight) and the multiply-accumulate output values (MAC) of the second type of the transpose memory unit 210b of FIG. 8, in a column multiply-accumulate operation. The multiply-accumulate output values can be computed by the multi-bit input values and the multi-bit weights in the vertical direction.

TABLE 5

| Weight | | Input | Input × Weight | |
|---|---|---|---|---|
| LBL(Q1) | LBL(Q0) | (C_RWL<n>) | (C_RBL<m>) | MAC |
| 1 | 1 | 1 | 3 × Idis | 3 |
| 1 | 0 | | 2 × Idis | 2 |
| 0 | 1 | | 1 × Idis | 1 |
| 0 | 0 | | 0 × Idis | 0 |
| 1 | 1 | 0 | 0 × Idis | 0 |
| 1 | 0 | | 0 × Idis | 0 |
| 0 | 1 | | 0 × Idis | 0 |
| 0 | 0 | | 0 × Idis | 0 |

Table 6 lists the multi-bit input values (Input), the multi-bit weights (Weight) and the multiply-accumulate output values (MAC) of the second type of the transpose memory unit 210b of FIG. 8, in a row multiply-accumulate operation. The multiply-accumulate output values can be computed by the multi-bit input values and the multi-bit weights in the horizontal direction.

TABLE 6

| Weight | | Input | Input × Weight | |
|---|---|---|---|---|
| LBL(Q1) | LBL(Q0) | (R_RWL<m>) | (R_RBL<n>) | MAC |
| 1 | 1 | 1 | 3 × Idis | 3 |
| 1 | 0 | | 2 × Idis | 2 |
| 0 | 1 | | 1 × Idis | 1 |
| 0 | 0 | | 0 × Idis | 0 |
| 1 | 1 | 0 | 0 × Idis | 0 |
| 1 | 0 | | 0 × Idis | 0 |

TABLE 6-continued

| Weight | | Input | Input × Weight | |
|---|---|---|---|---|
| LBL(Q1) | LBL(Q0) | (R_RWL<m>) | (R_RBL<n>) | MAC |
| 0 | 1 | | 0 × Idis | 0 |
| 0 | 0 | | 0 × Idis | 0 |

Figure 9:
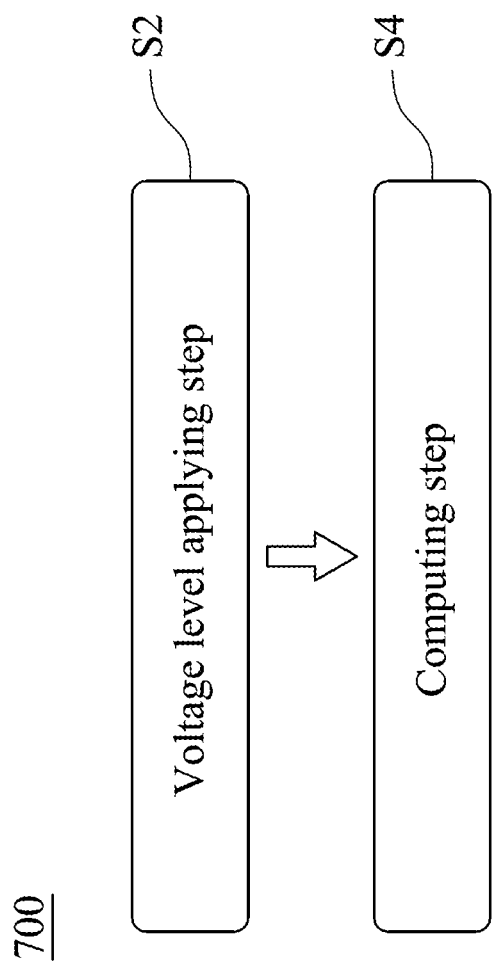
FIG. 9 shows a flow chart of a computing method of a transpose memory array structure for a plurality of multi-bit convolutional neural network based computing-in-memory applications according to a fifth embodiment of the present disclosure.

FIG. 9 shows a flow chart of a computing method 700 of a transpose memory array structure 100 for a plurality of multi-bit CNN based CIM applications according to a fifth embodiment of the present disclosure. The computing method 700 of the transpose memory array structure 100 for the multi-bit CNN based CIM applications is controlled by a first word line WL and a second word line HWL. The computing method 700 includes a voltage level applying step S2 and a computing step S4.

The voltage level applying step S2 includes applying a plurality of voltage levels to the first word line WL, the second word line HWL, the weight, the at least one first input word line (e.g., C_RWL<n> of FIGS. 2 and 8 or C_RWL_MSB<n> and C_RWL_LSB<n> of FIG. 3) and the at least one second input word line (e.g., R_RWL<m> of FIGS. 2 and 8 or R_RWL_MSB<m> and R_RWL_LSB<m> of FIG. 3) of each of the transpose memory units 210, 210a, 210b, respectively. The computing step S4 includes driving the transpose cell 214, 214a, 214b0, 214b1 of each of the transpose memory units 210, 210a, 210b to compute the voltage levels of the weight, the at least one first input word line and the at least one second input word line so as to generate the multiply-accumulate output value (MAC) on the one of the first output bit line C_RBL<m> and the second output bit line R_RBL<n> according to the at least one multi-bit input value multiplied by the weight. In addition, the at least one first input word line and the second output bit line R_RBL<n> are extended in a horizontal direction, and the first output bit line C_RBL<m> and the at least one second input word line are extended in a vertical direction.

According to the aforementioned embodiments and examples, the advantages of the present disclosure are described as follows.

1. The transpose memory unit for the multi-bit CNN based CIM applications and the transpose memory array structure for the multi-bit CNN based CIM applications and the computing method thereof of the present disclosure can operate the multi-bit input values and the weights at the same time without causing the write disturb issue.

2. The transpose memory unit for the multi-bit CNN based CIM applications and the transpose memory array structure for the multi-bit CNN based CIM applications and the computing method thereof of the present disclosure can utilize a two way transpose array to do training and inference in the horizontal and vertical directions respectively, thereby substantially reducing the latency and power consumption.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A transpose memory unit for a plurality of multi-bit convolutional neural network based computing-in-memory applications, which is controlled by a first word line and a second word line, and the transpose memory unit for the multi-bit convolutional neural network based computing-in-memory applications comprising:
a memory cell storing a weight, wherein the memory cell is controlled by the first word line and comprises a local bit line transmitting the weight; and
a transpose cell connected to the memory cell and receiving the weight via the local bit line, wherein the transpose cell comprises an input bit line, at least one first input word line, a first output bit line, at least one second input word line and a second output bit line, one of the at least one first input word line and the at least one second input word line transmits at least one multi-bit input value, and the transpose cell is controlled by the second word line to generate a multiply-accumulate output value on one of the first output bit line and the second output bit line according to the at least one multi-bit input value multiplied by the weight.

2. The transpose memory unit for the multi-bit convolutional neural network based computing-in-memory applications of claim 1, wherein,
the at least one multi-bit input value is a digital signal; and
the at least one first input word line and the second output bit line are extended in a horizontal direction, and the first output bit line and the at least one second input word line are extended in a vertical direction.

3. The transpose memory unit for the multi-bit convolutional neural network based computing-in-memory applications of claim 1, wherein the memory cell further comprises:
a first node storing the weight;
a second node storing an inverted weight opposite to the weight of the first node;
a local bit line bar connected to the transpose cell and transmitting the inverted weight to the transpose cell;
a first memory cell transistor connected to the first node, the local bit line and the first word line;
a second memory cell transistor connected to the second node, the local bit line bar and the first word line;
a first inverter located between the first node and the second node; and
a second inverter connected to the first inverter.

4. The transpose memory unit for the multi-bit convolutional neural network based computing-in-memory applications of claim 3, wherein a number of the at least one first input word line is one, a number of the at least one second input word line is one, a number of the at least one multi-bit input value is one, and the transpose cell further comprises:
a first transpose cell transistor connected to the second word line, the input bit line and the local bit line;
a second transpose cell transistor connected to the second word line, the first output bit line and the local bit line bar;
a third transpose cell transistor connected to the first input word line, the first output bit line and a third node;
a fourth transpose cell transistor connected to the second input word line, the first output bit line and the third node; and
a fifth transpose cell transistor connected to the local bit line, the second output bit line and the third node.

5. The transpose memory unit for the multi-bit convolutional neural network based computing-in-memory applications of claim 4, wherein,
when the first transpose cell transistor is turned on by the second word line, the memory cell is processed in one of a normal read operation and a normal write operation, the normal read operation represents that the weight in the memory cell is transmitted to the input bit line via the local bit line and the first transpose cell transistor, and the normal write operation represents that the weight is transmitted from the input bit line to the memory cell via the first transpose cell transistor and the local bit line; and
when the first transpose cell transistor is turned off by the second word line, the weight in the memory cell is configured to control the fifth transpose cell transistor to establish a current path via the fifth transpose cell transistor and one of the third transpose cell transistor and the fourth transpose cell transistor.

6. The transpose memory unit for the multi-bit convolutional neural network based computing-in-memory applications of claim 3, wherein a number of the at least one first input word line is two, a number of the at least one second input word line is two, a number of the at least one multi-bit input value is two, and the transpose cell further comprises:
a first transpose cell transistor connected to the second word line, the input bit line and the local bit line;
a second transpose cell transistor connected to the second word line, the first output bit line and the local bit line bar;
a third transpose cell transistor connected to one of the two first input word lines, the first output bit line and a third node;
a fourth transpose cell transistor connected to one of the two second input word lines, the first output bit line and the third node;
a fifth transpose cell transistor connected to the local bit line, the second output bit line and the third node;
a sixth transpose cell transistor connected to the local bit line, the second output bit line and a fourth node;
a seventh transpose cell transistor connected to another of the two first input word lines, the first output bit line and the fourth node; and
an eighth transpose cell transistor connected to another of the two second input word lines, the first output bit line and the fourth node.

7. The transpose memory unit for the multi-bit convolutional neural network based computing-in-memory applications of claim 6, wherein,
when the first transpose cell transistor is turned on by the second word line, the memory cell is processed in one of a normal read operation and a normal write operation, the normal read operation represents that the weight in the memory cell is transmitted to the input bit line via the local bit line and the first transpose cell transistor, and the normal write operation represents that the weight is transmitted from the input bit line to the memory cell via the first transpose cell transistor and the local bit line; and
when the first transpose cell transistor is turned off by the second word line, the weight in the memory cell is configured to control the fifth transpose cell transistor and the sixth transpose cell transistor to establish two current paths via the fifth transpose cell transistor, the sixth transpose cell transistor, one of the third transpose cell transistor and the fourth transpose cell transistor and one of the seventh transpose cell transistor and the eighth transpose cell transistor.

8. The transpose memory unit for the multi-bit convolutional neural network based computing-in-memory applications of claim 6, wherein each of the third transpose cell transistor, the fourth transpose cell transistor and the fifth transpose cell transistor has a first transistor width, and each of the sixth transpose cell transistor, the seventh transpose cell transistor, the eighth transpose cell transistor has a second transistor width, and the first transistor width is equal to twice the second transistor width.

9. The transpose memory unit for the multi-bit convolutional neural network based computing-in-memory applications of claim 3, further comprising:
  another memory cell storing another weight, wherein the another memory cell is controlled by the first word line; and
  another transpose cell connected to the another memory cell, the at least one first input word line, the first output bit line, the at least one second input word line and the second output bit line, wherein the another transpose cell receives the another weight from the another memory cell, and the transpose cell and the another transpose cell are controlled by the second word line to generate a multiply-accumulate output value on one of the first output bit line and the second output bit line according to the at least one multi-bit input value multiplied by a plurality of multi-bit weights, and the multi-bit weights are formed by the weight and the another weight.

10. A transpose memory array structure for a plurality of multi-bit convolutional neural network based computing-in-memory applications, which is controlled by a first word line and a second word line, and the transpose memory array structure for the multi-bit convolutional neural network based computing-in-memory applications comprising:
  a plurality of transpose memory units connected to each other via the first word line and the second word line, wherein each of the transpose memory units comprises:
    a memory cell storing a weight, wherein the memory cell is controlled by the first word line and comprises a local bit line transmitting the weight; and
    a transpose cell connected to the memory cell and receiving the weight via the local bit line, wherein the transpose cell comprises an input bit line, at least one first input word line, a first output bit line, at least one second input word line and a second output bit line, one of the at least one first input word line and the at least one second input word line transmits at least one multi-bit input value, and the transpose cell is controlled by the second word line to generate a multiply-accumulate output value on one of the first output bit line and the second output bit line according to the at least one multi-bit input value multiplied by the weight.

11. The transpose memory array structure for the multi-bit convolutional neural network based computing-in-memory applications of claim 10, wherein,
  the at least one multi-bit input value is a digital signal; and
  the at least one first input word line and the second output bit line are extended in a horizontal direction, and the first output bit line and the at least one second input word line are extended in a vertical direction.

12. The transpose memory array structure for the multi-bit convolutional neural network based computing-in-memory applications of claim 10, wherein the memory cell further comprises:

a first node storing the weight;
a second node storing an inverted weight opposite to the weight of the first node;
a local bit line bar connected to the transpose cell and transmitting the inverted weight to the transpose cell;
a first memory cell transistor connected to the first node, the local bit line and the first word line;
a second memory cell transistor connected to the second node, the local bit line bar and the first word line;
a first inverter located between the first node and the second node; and
a second inverter connected to the first inverter.

13. The transpose memory array structure for the multi-bit convolutional neural network based computing-in-memory applications of claim 12, wherein a number of the at least one first input word line is one, a number of the at least one second input word line is one, a number of the at least one multi-bit input value is one, and the transpose cell further comprises:
  a first transpose cell transistor connected to the second word line, the input bit line and the local bit line;
  a second transpose cell transistor connected to the second word line, the first output bit line and the local bit line bar;
  a third transpose cell transistor connected to the first input word line, the first output bit line and a third node;
  a fourth transpose cell transistor connected to the second input word line, the first output bit line and the third node; and
  a fifth transpose cell transistor connected to the local bit line, the second output bit line and the third node.

14. The transpose memory array structure for the multi-bit convolutional neural network based computing-in-memory applications of claim 13, wherein,
  when the first transpose cell transistor is turned on by the second word line, the memory cell is processed in one of a normal read operation and a normal write operation, the normal read operation represents that the weight in the memory cell is transmitted to the input bit line via the local bit line and the first transpose cell transistor, and the normal write operation represents that the weight is transmitted from the input bit line to the memory cell via the first transpose cell transistor and the local bit line; and
  when the first transpose cell transistor is turned off by the second word line, the weight in the memory cell is configured to control the fifth transpose cell transistor to establish a current path via the fifth transpose cell transistor and one of the third transpose cell transistor and the fourth transpose cell transistor.

15. The transpose memory array structure for the multi-bit convolutional neural network based computing-in-memory applications of claim 12, wherein a number of the at least one first input word line is two, a number of the at least one second input word line is two, a number of the at least one multi-bit input value is two, and the transpose cell further comprises:
  a first transpose cell transistor connected to the second word line, the input bit line and the local bit line;
  a second transpose cell transistor connected to the second word line, the first output bit line and the local bit line bar;
  a third transpose cell transistor connected to one of the two first input word lines, the first output bit line and a third node;

a fourth transpose cell transistor connected to one of the two second input word lines, the first output bit line and the third node;

a fifth transpose cell transistor connected to the local bit line, the second output bit line and the third node;

a sixth transpose cell transistor connected to the local bit line, the second output bit line and a fourth node;

a seventh transpose cell transistor connected to another of the two first input word lines, the first output bit line and the fourth node; and an eighth transpose cell transistor connected to another of the two second input word lines, the first output bit line and the fourth node.

16. The transpose memory array structure for the multi-bit convolutional neural network based computing-in-memory applications of claim 15, wherein, when the first transpose cell transistor is turned on by the second word line, the memory cell is processed in one of a normal read operation and a normal write operation, the normal read operation represents that the weight in the memory cell is transmitted to the input bit line via the local bit line and the first transpose cell transistor, and the normal write operation represents that the weight is transmitted from the input bit line to the memory cell via the first transpose cell transistor and the local bit line; and when the first transpose cell transistor is turned off by the second word line, the weight in the memory cell is configured to control the fifth transpose cell transistor and the sixth transpose cell transistor to establish two current paths via the fifth transpose cell transistor, the sixth transpose cell transistor, one of the third transpose cell transistor and the fourth transpose cell transistor and one of the seventh transpose cell transistor and the eighth transpose cell transistor.

17. The transpose memory array structure for the multi-bit convolutional neural network based computing-in-memory applications of claim 15, wherein each of the third transpose cell transistor, the fourth transpose cell transistor and the fifth transpose cell transistor has a first transistor width, and each of the sixth transpose cell transistor, the seventh transpose cell transistor, the eighth transpose cell transistor has a second transistor width, and the first transistor width is equal to twice the second transistor width.

18. The transpose memory array structure for the multi-bit convolutional neural network based computing-in-memory applications of claim 12, further comprising:

another memory cell storing another weight, wherein the another memory cell is controlled by the first word line; and another transpose cell connected to the another memory cell, the at least one first input word line, the first output bit line, the at least one second input word line and the second output bit line, wherein the another transpose cell receives the another weight from the another memory cell, and the transpose cell and the another transpose cell are controlled by the second word line to generate a multiply-accumulate output value on one of the first output bit line and the second output bit line according to the at least one multi-bit input value multiplied by a plurality of multi-bit weights, and the multi-bit weights are formed by the weight and the another weight.

19. A computing method of the transpose memory array structure for the multi-bit convolutional neural network based computing-in-memory applications of claim 10, which is controlled by the first word line and the second word line, and the computing method comprising:

performing a voltage level applying step, wherein the voltage level applying step comprises applying a plurality of voltage levels to the first word line, the second word line, the weight, the at least one first input word line and the at least one second input word line of each of the transpose memory units, respectively; and performing a computing step, wherein the computing step comprises driving the transpose cell of each of the transpose memory units to compute the voltage levels of the weight, the at least one first input word line and the at least one second input word line so as to generate the multiply-accumulate output value on the one of the first output bit line and the second output bit line according to the at least one multi-bit input value multiplied by the weight.

20. The computing method of claim 19, wherein the at least one first input word line and the second output bit line are extended in a horizontal direction, and the first output bit line and the at least one second input word line are extended in a vertical direction.

* * * * *